US008102292B1

United States Patent
Van Ess

(10) Patent No.: US 8,102,292 B1
(45) Date of Patent: Jan. 24, 2012

(54) ANALOG-TO-DIGITAL CONVERTER (ADC) HAVING A SUCCESSIVE-APPROXIMATION REGISTER DIGITAL TO-ANALOG CONVERTER (SARDAC)

(75) Inventor: David Van Ess, Arlington, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 19 days.

(21) Appl. No.: 12/753,681

(22) Filed: Apr. 2, 2010

Related U.S. Application Data

(60) Provisional application No. 61/237,270, filed on Aug. 26, 2009.

(51) Int. Cl.
*H03M 3/00* (2006.01)

(52) U.S. Cl. ..................................... 341/143; 341/163
(58) Field of Classification Search ................ 341/143, 341/163
See application file for complete search history.

(56) References Cited

U.S. PATENT DOCUMENTS

| | | | |
|---|---|---|---|
| 4,107,610 A * | 8/1978 | Weber | 375/245 |
| 6,346,898 B1 * | 2/2002 | Melanson | 341/143 |
| 7,209,069 B2 * | 4/2007 | Felder | 341/163 |
| 7,504,977 B2 * | 3/2009 | Doorenbos et al. | 341/143 |
| 7,511,648 B2 * | 3/2009 | Trifonov et al. | 341/143 |

* cited by examiner

*Primary Examiner* — Khai M Nguyen

(57) ABSTRACT

An analog-to-digital converter (ADC) having a successive-approximation register digital-to-analog converter (SARDAC) is described.

19 Claims, 5 Drawing Sheets

$$V_{out} = V_{in} + e_q(1-z^{-1})$$

ANALOG-TO-DIGITAL CONVERTER (ADC) HAVING A SUCCESSIVE-APPROXIMATION REGISTER DIGITAL TO-ANALOG CONVERTER (SARDAC)

RELATED APPLICATIONS

This application claims the benefit of U.S. Provisional Application No. 61/237,270, filed Aug. 26, 2009, which is incorporated herein by reference.

TECHNICAL FIELD

The present invention relates generally to analog-to-digital converters (ADCs) and, more particularly, to an ADC using a successive-approximation register digital-to-analog converter (SARDAC).

BACKGROUND

In electronics, an analog-to-digital converter (ADC), commonly referred to as ADC or A-to-D or A/D, is a device for converting an input analog voltage (or current) to a digital number proportional to the magnitude of the voltage (or current) or a digital code. Multi-level ADCs can be useful in high-speed applications, for example for converting an input analog signal into a digital signal prior to digital signal processing. There are various configurations of ADCs, but two main types are successive-approximation ADCs and delta sigma ADCs. A successive approximation ADC uses a comparator to reject ranges of voltages, eventually settling on a final voltage range. Successive approximation works by constantly comparing the input voltage to the output of an internal DAC, which is fed by the current value of the approximation, until the best approximation is achieved. At each step in this process, a binary value of the approximation is stored in a successive approximation register (SAR). The SAR uses a reference voltage (which is the largest signal the ADC is to convert) for comparisons. SAR type ADCs may include single slope converters, dual slope converters, and incremental converters (which can also be considered a continuous time delta sigma modulator (DSM)). The conventional delta sigma ADCs incorporate a noise-shaping technique that allows noise, introduced by the ADC (sometimes referred to as a quantizer), to be moved to frequencies that can be filtered out of the digital output. The delta sigma ADC uses a feedback DAC to feedback the error signal in the quantized output.

The resolution of the ADC indicates the number of discrete values the ADC can produce over the range of analog values. The values are usually stored electronically in binary form, so the resolution is usually expressed in bits. In consequence, the number of discrete values available, or "levels", is usually a power of two. For example, an ADC with a resolution of 8 bits can encode an analog input to one in 256 different levels, since $2^8=256$. The values can represent the ranges from 0 to 255 (i.e. unsigned integer). To increase the effective resolution for an ADC, multiple samples can be filtered to produce more resolution, such as illustrated in the ADC circuit 100 of FIG. 1A. For every N samples the noise is reduced by $\sqrt{N}$. Another conventional method is to use a feedback DAC to build a delta sigma modulator, such as illustrated in the delta sigma modulator 150 of FIG. 1B. Conventional delta sigma ADCs (D-S ADCs) typically include a difference (delta) circuit, an integrator or accumulator (sigma) circuit, and a quantization (modulation) circuit, including an ADC and a feedback DAC, such as illustrated in the circuit 150 of FIG. 1B. Using the proper filter for N samples, the noise can be reduced by $N^{3/2}$. Both of these techniques are well understood and commonly used in industry.

Averaging signals only gives you ½ bit increase in resolution for every doubling of samples. This works out to be one extra bit of resolution for each ¼ reduction in the sample rate. For example, as shown in FIG. 1, increasing the resolution by 4 bits (16) requires 256 samples ($16^2$), effectively reducing the data rate by that amount. A 1 Ms/s at 12 bits becomes 16 bits at 3.9 ks/s. Clearly the sample rate has been seriously affected. In a delta sigma configuration, the feedback DAC allows the noise to be shaped using less extreme filtering. Averaging N values results in a noise improvement of $$\frac{1}{\sqrt{N^3}}.$$

This works out to be 3 extra bits of resolution for every ¼ reduction in the sample rate. For example, a 12-bit ADC with a feedback DAC only requires 8, 12-bit samples to produce a 16-bits resolution. For the same 1 Ms/s ADC the new rate is @ 125 ks/s.

The disadvantage of conventional multi-bit delta sigma modulators, such as illustrated in FIG. 1B, is that performance is limited by the mismatch and nonlinearity of the ADC and the feedback DAC. For ideal quantization in the DSM, the results are shown in the equation (1) below:

$$\text{DAC}(\text{ADC}(v_{in}))=v_{in}+e_q, \quad (1)$$

where $e_q$ represents the quantization error. Quantization error is due to the finite resolution of the ADC, and is an unavoidable imperfection in all types of ADC. The quantization error may be measured in terms of the least significant bit (LSB). Equation (2) shows the relationship between the output and the input in an ideal DSM.

$$V_{out}=V_{in}+e_q(1-z^{-1}) \quad (2)$$

However, when the ADC and DAC of the circuit are mismatched, the results from the quantization mismatch are shown in the following equation (3):

$$\text{DAC'}(\text{ADC}(v_{in}))=v_{in}+\epsilon(v_{in})+e_q, \quad (3)$$

where $e_q$ represents the quantization error and e represents the noise introduced from the mismatch. Equation (4) shows the relationship between the output and the input in a mismatched DSM.

$$V_{out}=V_{in}+\epsilon(V_{in})+e_q(1-z^{-1}), \quad (4)$$

Thus, mismatches in the ADC/DACs results in distortion, limiting the resolution enhancement because the distortion adds noise to the output signal and reduces the overall signal to noise ratio.

BRIEF DESCRIPTION OF THE DRAWINGS

The present disclosure is illustrated by way of example, and not by way of limitation, in the figures of the accompanying drawings.

DETAILED DESCRIPTION

An ADC having a successive-approximation register digital-to-analog converter (SARDAC) is described. In one embodiment, the SARDAC circuit includes a comparator to receive an input voltage at a first input terminal, logic circuitry coupled to the output of the comparator to provide a digital output at a first output terminal, and a digital-to-analog converter (DAC) coupled to convert the digital output of the logic circuitry into an analog output. The resulting DAC value is the same voltage that would be constructed from a separate feedback DAC in a conventional circuit. The embodiments described herein, instead of using a separate feedback DAC, the resulting DAC value is used for the reconstruction value so that there is no ADC/DAC mismatch distortion. In one embodiment, the DAC is configured to feedback the analog output to a second input of the comparator and provide the analog output as a second output of the ADC to be used for the reconstruction value. Since there is no ADC/DAC mismatch, the distortion may be limited to the integral nonlinearity (INL) and differential nonlinearity (DNL) of the DAC. The INL is a term describing the maximum deviation between the ideal output of a DAC and the actual output level and the DNL is a term describing the deviation between two analog values corresponding to adjacent input digital values. In one embodiment, the INL/DNL from the INL/DNL of the DAC can be reduced by using the DAC to add a large dither to the input and subtract its contribution from the answer later. This effectively moves the signal around different ranges of the ADC range to reduce the effect of the distortion from the INL/DNL of the DAC.

Figure 1A:
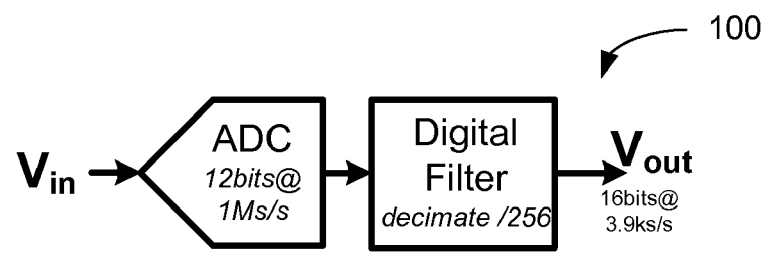
FIG. 1A illustrates a conventional ADC circuit.
Figure 1B:
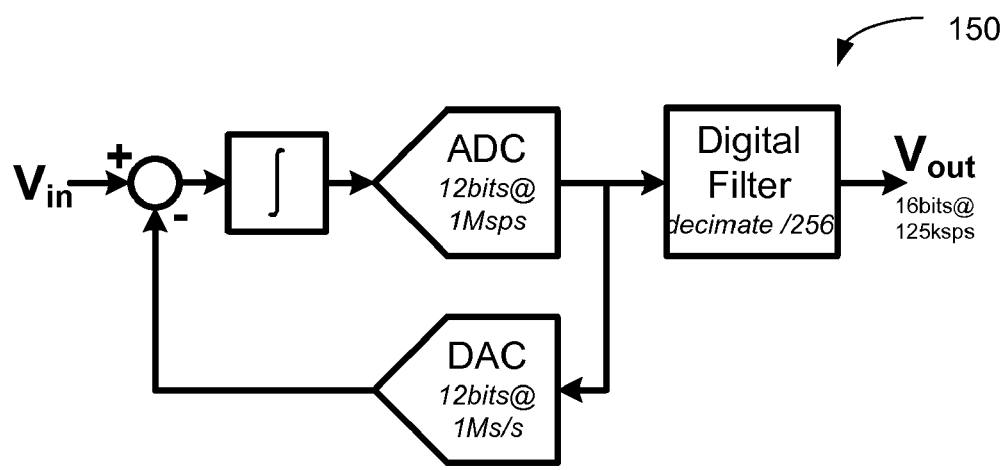
FIG. 1B illustrates a conventional delta sigma ADC.

In one embodiment, the ADC is a SARDAC that is configured to convert the input voltage into the digital output via a binary search, provide the digital output as a first output of the SARDAC, and provide the analog output as a separate output of the SARDAC. For example, the SARDAC may be used in a delta sigma modulator (DSM) topology, and in such topology, the DAC operates as a delta sigma feedback DAC. Since the SARDAC already uses a DAC to feedback the analog output to the comparator, the SARDAC can provide this same analog output as the delta sigma feedback to a difference circuit of the DSM without an additional external delta sigma feedback DAC. In particular, by making the output of the DAC available as its own output, the SARDAC does not need an additional delta sigma feedback DAC to provide the delta sigma feedback signal, as described above with respect to the delta sigma modulator 150 of FIG. 1B.

The embodiments described herein provide a circuit and method that increases the resolution of the ADC without significantly reducing the sample rate. In one embodiment, the circuit allows a 12-bit 1 Ms/s ADC to be used to construct a 16-bit 125 ks/s delta sigma ADC. Alternatively, other resolutions may be achieved. Also, since the DAC is shared with the ADC function, there is distortion mismatch in their transfer function. The embodiments described herein may be used for building a higher resolution ADC with components that can be reconfigured to be a high-speed topology. For example, the components of the SARDAC may be configured to operate as components of a delta sigma ADC in a first programmable mode, and at least one of the comparator and DAC of the SARDAC can be used as a part in another circuit in a second programmable mode, such as components of a SAR. Not only will the components of these circuits be built of common hardware, the reconfiguration of these components can be dynamic, such as in a programmable system. In another embodiment, the ADC is configured as a high-speed ADC in a first programmable mode and as a lower-speed ADC in a second programmable mode, where the lower-speed ADC has a higher resolution than the high-speed ADC.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

References in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 2:
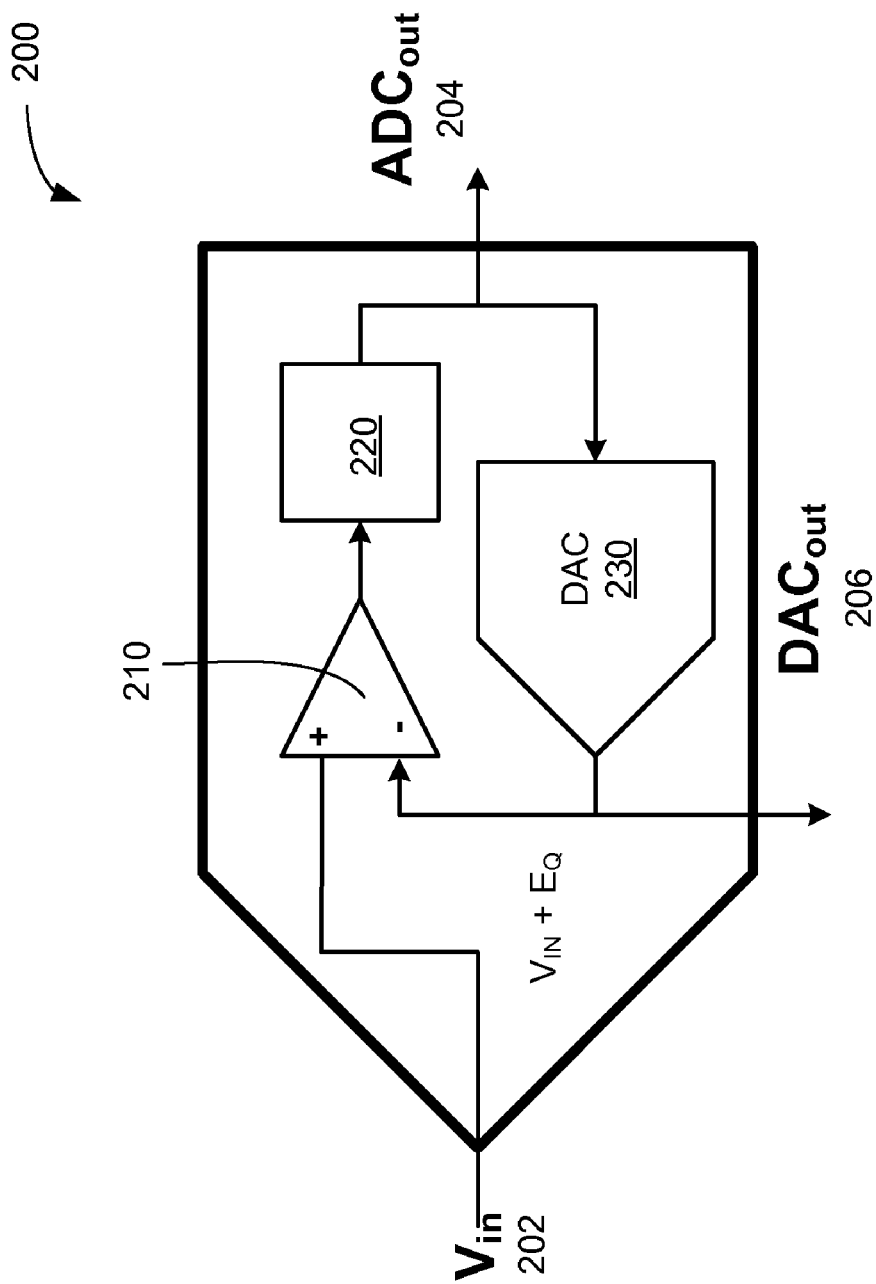
FIG. 2 illustrates one embodiment of a successive-approximation register digital-to-analog converter (SARDAC).

FIG. 2 illustrates one embodiment of a successive-approximation register digital-to-analog converter (SARDAC) 200. The SARDAC 200 includes a comparator 210 to receive an input voltage 202 (Vin) at a first input terminal, logic circuitry 220 coupled to the output of the comparator 210, and a DAC 230 coupled to receive the digital output of the logic circuitry 220. The logic circuitry 220 receives the output of the comparator and digitizes the output of the comparator into a digital output 204 (ADCout) at a first output terminal of the SARDAC 200. In one embodiment, the logic circuitry 220 is SAR logic, which is used to digitize the output of the comparator into the digital output 204 via a binary search. In one embodiment, the comparator 210 and logic circuitry 220 digitize a continuous analog waveform into a discrete digital representation via a binary search through all possible quantization levels before finally converging upon a digital output for each conversion. In another embodiment, the logic circuitry 220 digitizes the output of the comparator into the digital output 204 using predictive coding logic. Alternatively, other logic can be used to digitize the output of the comparator 210 as would be appreciated by one of ordinary skill in the art having the benefit of this disclosure.

The DAC 230 receives the digital output 204 of the logic circuitry 220 and converts the digital output 204 into an analog output 206 (DACout). The DAC 230 feeds back the analog output 206 into a second input terminal of the comparator 210 to be subtracted from the input voltage 202 (Vin), as well as provide the analog output 206 at a second output terminal of the SARDAC 200. The logic circuitry 220 controls the DAC 230 to determine the correct digital output 204 corresponding to the input voltage 202 using successive approximation.

In one embodiment, the SARDAC 200 is implemented in an ADC circuit. In another embodiment, the SARDAC 200 is implemented in a delta sigma ADC, such as described and illustrated with respect to FIG. 3. When the SARDAC 200 is used in the delta sigma modulator (DSM) topology, the DAC 230 is a delta sigma feedback DAC in the DSM topology. In essence, the SARDAC 200 provides the delta sigma feedback without an additional delta sigma feedback DAC. By using the DAC 230 as the delta sigma feedback DAC, the SARDAC 200 reduces the number of components of the ADC, since a separate feedback DAC is no longer needed for the delta sigma ADC. Also, since the analog output 206 of the DAC 230 is the same voltage that would be constructed from a conventional, separate feedback circuit DAC, the resulting DAC value can be used for the reconstruction value, so that there is no ADC/DAC mismatch distortion as described above with respect to the conventional delta sigma ADCs. Since a separate feedback DAC is no longer needed for the delta sigma ADC, the size of the ADC can be reduced using the SARDAC 200.

In one embodiment, the SARDAC 200 reduces a mismatch distortion between an analog-to-digital conversion and a digital-to-analog conversion by the delta sigma ADC. In another embodiment, the SARDAC 200 increases a resolution of the delta sigma ADC as compared to conventional delta sigma ADCs that do not use the SARDAC 200.

In one embodiment, the SARDAC 200 is implemented in a programmable system, such as, for example, in the Programmable System on a Chip (PSOC®), developed by Cypress Semiconductor of San Jose, Calif. Alternatively, the SARDAC 200 can be implemented in other processing devices, such as, for example, a microcontroller, a microprocessor, a processor, a Direct memory access (DMA) controller, programmable logic, or other type of processing element as would be appreciated by one of ordinary skill in the art having the benefit of this disclosure. In one embodiment, the programmable system can dynamically configure components of the SARDAC 200 to operate in different circuit configurations in multiple modes. In one embodiment, the programmable system can configure the SARDAC 200 to operate in a delta sigma ADC configuration in a first programmable mode, and can configure at least one of the components of the SARDAC 200 to operate as part of another circuit in a second programmable mode. When using the SARDAC 200 in a programmable system, the programmable system allows common hardware to be used in different circuits in the different programmable modes. In one embodiment, the programmable system dynamically configures the components of the SARDAC 200 to operate as a high-speed ADC in first programmable mode and as a lower-speed ADC in a second programmable mode, where the lower-speed ADC has a higher resolution than the high-speed ADC. In another embodiment, the programmable system configures the SARDAC 200 to operate as a SAR ADC circuit that converts the input voltage 202 into the digital output 204 via a binary search without delta sigma feedback.

Figure 3:
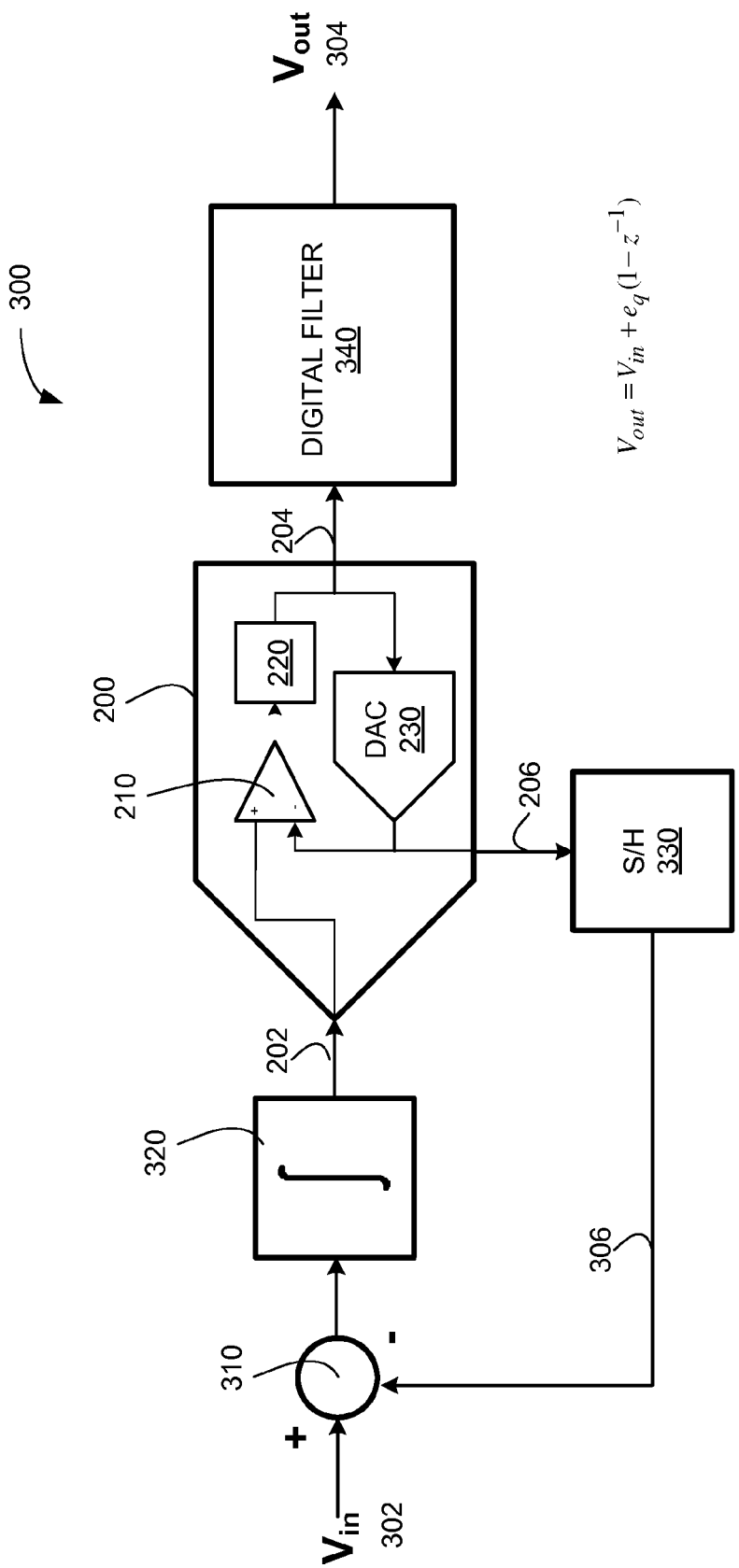
FIG. 3 illustrates one embodiment of a delta sigma ADC using the SARDAC of FIG. 2.

FIG. 3 illustrates one embodiment of a delta sigma ADC 300 using the SARDAC 200 of FIG. 2. The delta sigma ADC 300 includes a difference circuit 310, an integrator 320, the SARDAC 200, a sample and hold (S/H) circuit 330, and a digital filter 340. The difference circuit 310 receives an input signal 302 (Vin) and a feedback signal 306 and calculates the difference. The integrator 320 is coupled to receive the difference (i.e., output of the difference circuit). The integrator 320 integrates the difference and provides the input voltage 202 at the first terminal of the comparator 210 of the SARDAC 200 as described above. The SARDAC 200 converts the input voltage 202 into the digital output 204 and converts the digital output 204 into the analog output 206. The SARDAC 200 provides the digital output 204 to the digital filter 340 and provides the analog output 206 to the S/H circuit 330. The S/H circuit 330 receives the analog output 206 from the SARDAC 200 and samples and holds the analog output as the feedback signal 306, which is provided to the difference circuit 310.

The delta sigma ADC 300 oversamples the desired signal by a large factor and filters the desired signal band. The resulting signal, along with the error generated by the quantization by the SARDAC 200, is fed back and subtracted from the input of the delta sigma ADC 300. This negative feedback has the effect of noise shaping the quantization error due to the SARDAC 200 so that it does not appear in the desired signal frequencies. The noise shaping is a technique that increases the apparent signal to noise ratio of the resultant signal by altering the spectral shape of the error that is introduced by differing and quantization such that the noise power is pushed to a higher level in frequency bands while the signal power is pushed to a lower level in frequency bands.

In the depicted embodiment, the digital filter 340 is coupled to receive the digital output 204 of the SARDAC 200. The digital filter 340 converts the digital output 204 into a digital output value 304 (Vout). Equation (5) shows the relationship between the digital output value 304 (Vout) and the input signal 302 (Vin) when using the SARDAC 200 in the delta sigma ADC 300.

$$V_{out}=V_{in}+e_q(1-z^{-1}),\qquad(5)$$

It should be noted that this equation is the same as equation (2) which shows the relationship between the output and input in an ideal DSM, resulting in no mismatch in the transfer function because there is no ADC/DAC distortion component like in the transfer function of the conventional mismatched DSM shown in equation (4).

In one embodiment, the digital filter is a decimation filter. Alternatively, other types of filters can be used as would be appreciated by one of ordinary skill in the art having the benefit of this disclosure. The digital filter 340, such as, for example, a decimation filter, at the output of the SARDAC 200 may reduce the sampling rate, filter off unwanted noise signals, and increase the resolution of the output of the delta sigma ADC 300.

In one embodiment, the SARDAC 200 outputs the digital output 204 as a digital stream having a density. The density of the digital output 204 may be the percentage that the digital stream is high. The particular waveform is not important, just the percentage that the signal is high. The digital filter 340 converts a density value to an analog or a digital output value 304. Alternatively, the digital output 204 can be processed in various ways to be useable by other components of the system, such as other components of the programmable system.

Although FIG. 3 illustrates a first-order delta sigma ADC (also referred to as a single-order DSM), in other embodiments, the SARDAC 200 can be used in multi-order delta sigma ADCs. For example, in one embodiment of a second-order delta sigma ADC, the circuit includes first and second difference circuits, first and second integrators, the SARDAC 200, and the S/H circuit 330. The first difference circuit receives a first input signal and a feedback signal from the S/H circuit 330 to calculate a first difference. The first integrator, coupled to the first difference circuit, receives an output of the first difference circuit, integrates the first difference, and provides a second input signal. The second difference circuit receives the second input signal and the feedback signal from the S/H circuit 330, and calculates a second difference. The second integrator receives an output of the second difference circuit, i.e., the second difference, integrates the second difference and provides the input voltage at the first terminal of the comparator 210 of the SARDAC 200. The SARDAC 200 converts the input voltage into the digital output and converts the digital output into the analog output, as described above, providing the analog output as a separate output to the S/H circuit 330 and the digital output to the digital filter 340, which converts the digital output of the SARDAC 200 into a digital output value.

As with the first-order delta sigma ADC, the output is a sum of the low pass filtered input signal and the high pass filtered quantization noise. But with the second-order delta sigma ADC, the roll off is enhanced. In the first-order delta sigma ADC, the quantization noise has been shaped further toward the higher end of the spectrum, where the lower the frequency the less quantization noise. Just like filters, higher order modulators can be built with the addition of integrators and quantization feedback. As the order increases the quantization noise decreases as would be appreciated by one of ordinary skill in the art having the benefit of this disclosure. However, higher order modulators may be more complex to implement, and require additional hardware.

It should be noted that the embodiments described above use an integrator 320 since the delta sigma ADC 300 represents a linear model of a continuous time circuit. In other embodiments, the delta sigma ADC 300 may be implemented as a discrete time circuit, in which case the integrator 320 would be replaced with an accumulator, which is a discrete time integrator, as would be appreciated by one of ordinary skill in the art having the benefit of this disclosure.

Figure 5:
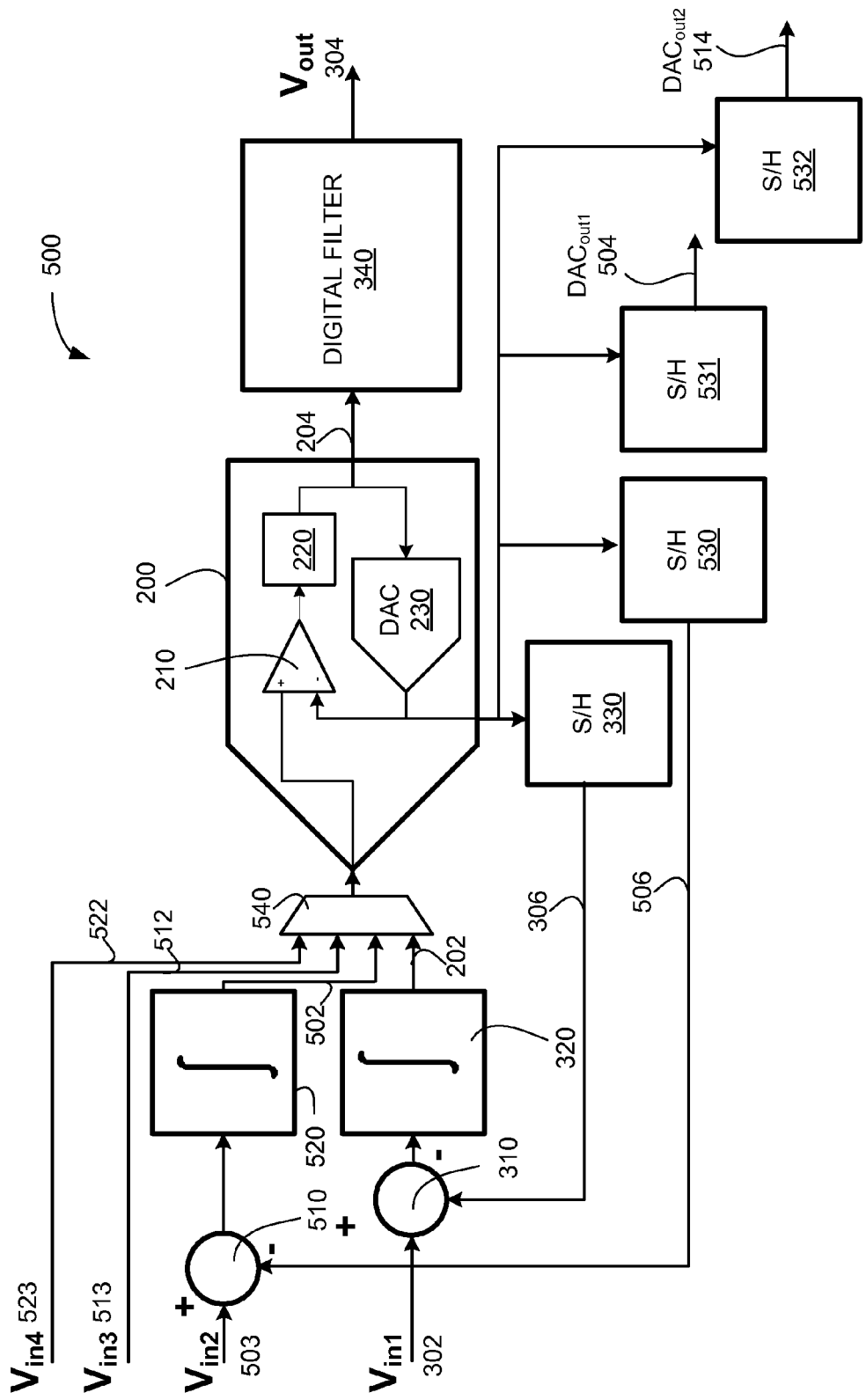
FIG. 5 illustrates one embodiment of a multi-channel delta sigma ADC using the SARDAC of FIG. 2.

It should also be noted that although the SARDAC 200 has been illustrated as being used in a first-order delta sigma ADC, in other embodiments, the SARDAC 200 can be used in other configurations of delta sigma ADCs. For example, FIG. 5 illustrates one embodiment of a multi-channel delta sigma ADC using the SARDAC of FIG. 2. The circuit 500 includes the delta sigma ADC 300 as described above with respect to FIG. 3 as indicated by similar reference numbers. The circuit 500 also includes a second difference circuit 510 that receives a second input signal 503 (Vin2) and a second feedback signal 506 from a second S/H circuit 530 and calculates the difference. A second integrator 520 is coupled to receive the difference (i.e., output of the difference circuit 510). The second integrator 520 integrates the difference and provides a second input voltage 502. A multiplexer 450, or other type of selection circuit, receives the first input voltage 202 from the integrator 320 and the second input voltage 520 from the second integrator 520. The multiplexer 450 can be used to select which channel is to be coupled to the SARDAC 200. Although FIG. 5 illustrates two channels, in other embodiments, additional channels can be added to use the SARDAC 200.

In another embodiment, the multiplexer 540 can also receive other inputs from other sources to be used by the SARDAC 200 in other modes, such as the input voltages 513 and 523 (Vin3 and Vin4) illustrated in FIG. 5. The input voltages 513 and 523 can be input voltages for multiple SAR channels. These have been illustrated in FIG. 5 to show that the SARDAC 200 can be configured to receive different inputs based on different modes. In one embodiment, the multiplexer 540 can select, based on the mode, one of the four inputs 202, 502, 512, or 522 to feed to the SARDAC 200. In another embodiment, one or more S/H circuits, such as S/H circuits 531 and 532, can be coupled to the output of the DAC 230 to provide the DAC outputs 504 and 514 (DACout1 and DACout2), respectively. The DAC outputs 504 and 514 can be used in separate modes, such as outputs for the two different SAR channels corresponding to the input voltages 513 and 523. Alternatively, the SARDAC 200 can be used in other configurations as would be appreciated by one of ordinary skill in the art having the benefit of this disclosure. As described herein, the SARDAC 200 can be programmed to operate in a first-order or multi-order delta sigma ADC in a first programmable mode, and as another circuit, such as a SAR ADC, in another programmable mode.

Figure 4:
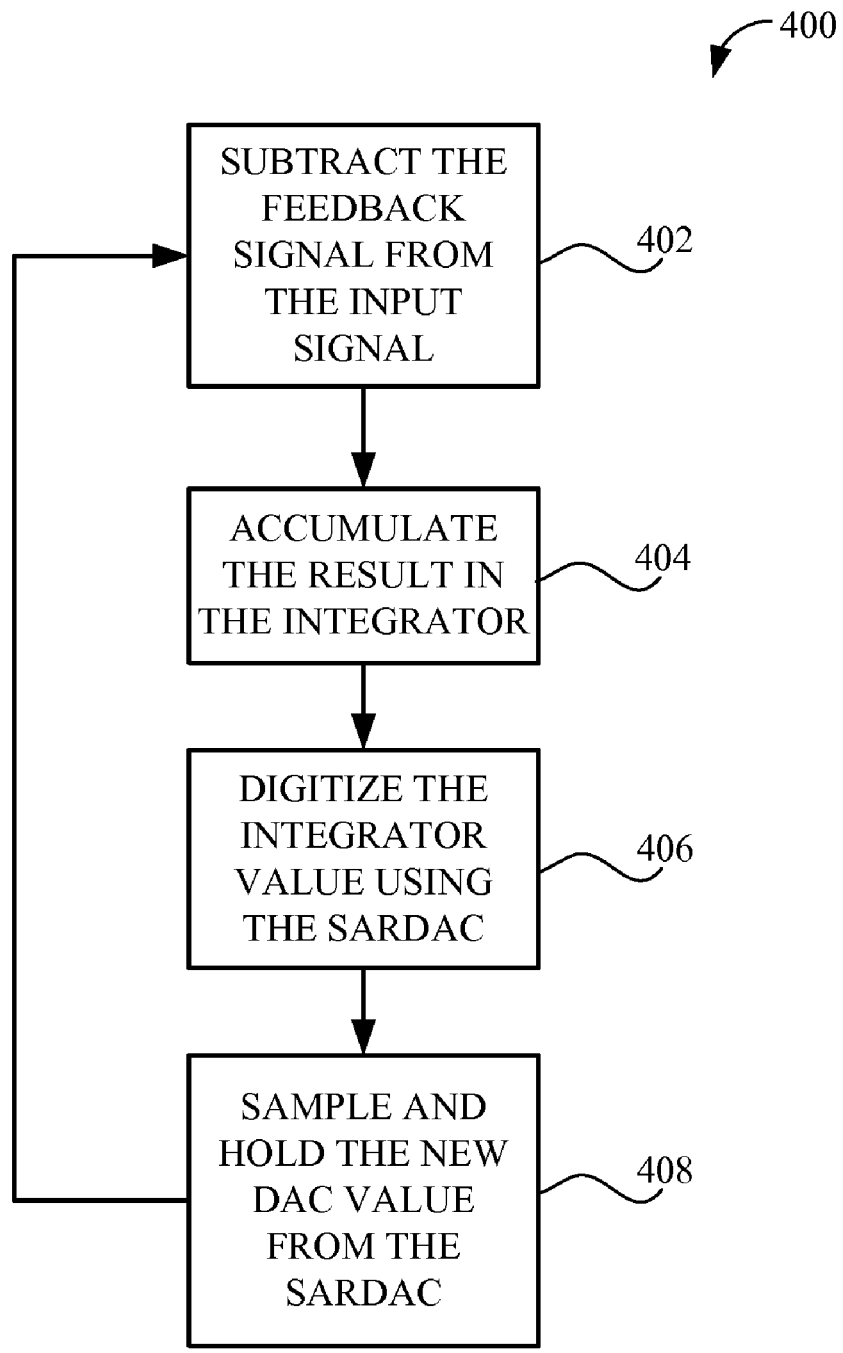
FIG. 4 illustrates a flow diagram of a method of operating a delta sigma ADC according to one embodiment.

FIG. 4 illustrates a flow diagram of a method of operating the delta sigma ADC 300 of FIG. 3 according to one embodiment. In one embodiment, the delta sigma ADC 300 implements the operations of the method 400. In other embodiments, other components may perform some or all of the operations of the method 400.

The method 400 begins by subtracting the feedback signal from the input signal. Next, the method accumulates the result of the subtraction using an integrator (or an accumulator for discrete time), and digitizes the integrator value using the SARDAC 200 as described herein. In one embodiment, the SARDAC performs the following operations: 1) receiving an input voltage at an input terminal of the SARDAC; 2) converting the input voltage into a digital output via a binary search or via predictive coding; 3) converting the digital output into an analog output using the DAC of the SARDAC; and 4) providing the digital output at a first terminal of the SARDAC and the analog output at a second output terminal of the SARDAC. The method may further convert the digital output into a digital output value using a digital filter coupled to the first output terminal of the SARDAC. The method also provides the analog output to the sample and hold circuit of the delta sigma ADC to be used as the feedback signal in the delta sigma ADC. The method uses the feedback signal to calculate a difference between the input signal and the feedback signal at block 402, the difference being integrated at block 404 to generate the input voltage at the input terminal of the SARDAC.

In another embodiment, a programmable system implements a method of dynamically configuring the SARDAC 200 to operates as a high-speed ADC in a first programmable mode, for example, a SAR ADC, and as a lower-speed ADC in a second programmable mode, where the lower-speed ADC has a higher resolution than the high-speed ADC. Alternatively, the method may dynamically reconfigure the components of the circuit in other configuration as would be appreciated by one of ordinary skill in the art having the benefit of this disclosure.

In one embodiment, the method converts the input voltage into the digital output via a binary search using the comparator, SAR logic, and the DAC of the SARDAC. In another embodiment, the method converts the input voltage into the digital output via predictive coding. Alternatively, other techniques may be used to determine the corresponding digital output for the input voltage. It should also be noted that although various embodiments describe the use of input and output voltages, in other embodiments, the circuits can be configured to accommodate input and output currents as would be appreciated by one of ordinary skill in the art having the benefit of this disclosure.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain portions of the embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will be evident, however, that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit, comprising:
    an analog-to-digital converter (ADC), comprising:
        a comparator to receive an input voltage at a first input terminal;
        logic circuitry coupled to the output of the comparator, wherein the logic circuitry is configured to provide a digital output at a first output terminal of the ADC; and
        a digital-to-analog converter (DAC) coupled to receive the digital output of the logic circuitry, wherein the DAC is configured to convert the digital output into an analog output, feedback the analog output into a second input terminal of the comparator, and provide the analog output at a second output terminal of the ADC; and
    a sample and hold circuit coupled to receive the analog output from the second output terminal of the ADC, wherein the sample and hold circuit is configured to sample and hold the analog output as a feedback signal and provide the feedback signal to a first difference circuit.

2. The circuit of claim 1, wherein the ADC is a Successive-approximation Register DAC (SARDAC) configured to digitize the input voltage into the digital output via a binary search, provide the digital output as a first output of the SARDAC, and provide the analog output as a separate output of the SARDAC.

3. The circuit of claim 2, wherein the SARDAC is implemented in a delta sigma modulator (DSM) topology, wherein the DAC of the SARDAC is a delta sigma feedback DAC in the DSM topology.

4. The circuit of claim 2, wherein the SARDAC is implemented in a delta sigma ADC that uses the feedback signal as a delta sigma feedback, wherein the SARDAC is configured to provide the delta sigma feedback without an additional delta sigma feedback DAC.

5. The circuit of claim 2, further comprising:
    the first difference circuit to receive an input signal and the feedback signal to calculate a difference;
    an integrator coupled to receive an output of the difference circuit, to integrate the difference, and to provide the input voltage at the first terminal of the comparator;
    the SARDAC coupled to receive an output of the integrator, wherein the output of the integrator is the input voltage at the first terminal of the comparator, wherein the SARDAC is configured to convert the input voltage into the digital output and convert the digital output into the analog output, wherein the SARDAC is further configured to provide the digital output as the first output, the analog output as the separate output, and the analog output at the second output terminal of the comparator.

6. The circuit of claim 5, further comprising a digital filter coupled to receive the digital output of the SARDAC, wherein the digital filter is configured to convert the digital output of the SARDAC into a digital output value.

7. The circuit of claim 2, wherein the SARDAC is implemented in a multi-order delta sigma ADC.

8. The circuit of claim 7, wherein the multi-order delta sigma ADC is a second-order delta sigma ADC, wherein the second-order delta sigma ADC comprises:
    the first difference circuit to receive a first input signal and the feedback signal to calculate a first difference;
    a first integrator coupled to receive an output of the first difference circuit, to integrate the first difference, and provide a second input signal;
    a second difference circuit to receive the second input signal and the feedback signal to calculate a second difference;
    a second integrator coupled to receive an output of the second difference circuit, to integrate the second difference, and to provide the input voltage at the first terminal of the comparator; and
    the SARDAC coupled to receive an output of the second integrator, wherein the output of the second integrator is the input voltage at the first terminal of the comparator, wherein the SARDAC is configured to convert the input voltage into the digital output and convert the digital output into the analog output, wherein the SARDAC is further configured to provide the digital output as the first output, the analog output as the separate output, and the analog output at the second output terminal of the comparator.

9. The circuit of claim 2, wherein the SARDAC is implemented in a multi-channel delta sigma modulator (DSM) topology, wherein the DAC of the SARDAC is a delta sigma feedback DAC in the DSM topology.

10. The circuit of claim 1, wherein the ADC is a Successive-approximation Register (SAR) DAC of a delta sigma ADC in a first programmable mode, and wherein at least one of the comparator and DAC of the ADC is used as a part in another circuit in a second programmable mode.

11. The circuit of claim 10, wherein the comparator, the logic circuitry, and the DAC are used as parts in a Successive-approximation Register (SAR) ADC that converts the input voltage into the digital output via a binary search without delta sigma feedback.

12. The circuit of claim 1, wherein the ADC is dynamically configured as a high-speed ADC in a first programmable mode and as a lower-speed ADC in a second programmable mode, wherein the lower-speed ADC has a higher resolution than the high-speed ADC.

13. An apparatus, comprising:
a delta sigma analog-to-digital converter (ADC) to receive an input voltage and to provide a digital output value corresponding to the input voltage, wherein the delta sigma ADC uses a delta sigma feedback and comprises a digital-to-analog converter (DAC); and
means for providing the delta sigma feedback without an additional delta sigma feedback DAC; and
means for dynamically reconfiguring the delta sigma ADC between a high-speed ADC in a first programmable mode and a lower-speed ADC in a second programmable mode, wherein the lower-speed ADC has a higher resolution than the high-speed ADC.

14. The apparatus of claim 13, wherein the means for providing the delta sigma feedback reduces a mismatch distortion between an analog-to-digital conversion and a digital-to-analog conversion by the delta sigma ADC.

15. The apparatus of claim 13, wherein the means for providing the delta sigma feedback increases a resolution of the delta sigma ADC.

16. A method, comprising:
receiving an input voltage at an input terminal of a Successive-approximation Register DAC (SARDAC), the SARDAC comprising an analog-to-digital converter (ADC) and a digital-to-analog converter (DAC);
converting the input voltage into a digital output using the ADC;
converting the digital output into an analog output using the DAC;
providing the analog output as feedback to the ADC;
providing the digital output at a first output terminal of the SARDAC and the analog output at a second output terminal of the SARDAC;
sampling and holding the analog output at the second output terminal as a feedback signal;
calculating a difference between an input signal and the feedback signal; and
integrating the difference to generate the input voltage at the input terminal of the SARDAC.

17. The method of claim 16, wherein said converting the input voltage comprises comparing the input voltage with the analog output.

18. The method of claim 16, further comprising converting the digital output of the SARDAC into a digital output value.

19. A method, comprising:
receiving an input voltage at an input terminal of a Successive-approximation Register DAC (SARDAC), the SARDAC comprising a digital-to-analog converter (DAC);
converting the input voltage into a digital output;
converting the digital output into an analog output using the DAC;
providing the digital output at a first output terminal of the SARDAC and the analog output at a second output terminal of the SARDAC; and
dynamically reconfiguring the SARDAC to be used in a high-speed analog-to-digital converter (ADC) in a first programmable mode and as a lower-speed ADC in a second programmable mode, wherein the lower-speed ADC has a higher resolution than the high-speed ADC.

* * * * *